(12) United States Patent
Lin

(10) Patent No.: US 6,587,352 B1
(45) Date of Patent: *Jul. 1, 2003

(54) FEMALE SCREW DEVICE PRACTICAL FOR INSTALLATION IN A MOTHERBOARD BY A SMT AUTOMATIC MACHINE

(76) Inventor: Chiang Chun Lin, 4F, No. 282, Chung Shan 1st Rd., Lu Chou City, Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/176,039

(22) Filed: Jun. 21, 2002

(51) Int. Cl.[7] .............................. H05K 5/00; H05K 5/04
(52) U.S. Cl. ................... 361/758; 361/719; 361/742; 174/138 D; 174/138 G; 206/706
(58) Field of Search .................. 361/719, 720, 361/742, 756, 758, 759, 760, 810; 179/138 D, 138 G, 256; 403/24, 409.1; 206/706

(56) References Cited

U.S. PATENT DOCUMENTS

| | | | | |
|---|---|---|---|---|
| 4,875,140 A | * | 10/1989 | Delpech et al. ............. 361/789 |
| 5,618,129 A | * | 4/1997 | Skarivoda ................... 403/389 |
| 5,671,124 A | * | 9/1997 | Ho ............................. 361/758 |
| 5,724,229 A | * | 3/1998 | Tustaniwskyi et al. ..... 361/719 |
| 5,978,232 A | * | 11/1999 | Jo .............................. 361/796 |
| 6,225,566 B1 | * | 5/2001 | Dienst .................... 174/138 E |
| 6,399,887 B1 | * | 6/2002 | Lin ....................... 174/138 D |

\* cited by examiner

Primary Examiner—David Martin
Assistant Examiner—Thanh S. Phan
(74) Attorney, Agent, or Firm—Browdy and Neimark, P.L.L.C.

(57) ABSTRACT

A female screw device is constructed to include a female screw rod adapted for mounting in a mounting hole of a motherboard to support an object above the motherboard, the female screw rod having an axially extended screw hole for the installation of a screw, and a quick-release cap adapted for fastening to the female screw rod to close the screw hole for enabling the female screw rod to be installed in a mounting hole of a motherboard by a SMT automatic machine, the quick-release cap having a cap body and a plurality of springy retaining arms adapted for fastening to the screw hole of the female screw rod to secure the cap body to the female screw rod to block up the screw hole.

2 Claims, 6 Drawing Sheets

FEMALE SCREW DEVICE PRACTICAL FOR INSTALLATION IN A MOTHERBOARD BY A SMT AUTOMATIC MACHINE

BACKGROUND OF THE INVENTION

1. Field of the Invention

The present invention relates to a female screw device and, more particularly, to such a female screw device, which is practical for installation in a motherboard by a SMT (surface mounting technique) automatic machine.

2. Description of the Prior Art

A computer motherboard has a plurality of mounting holes for the mounting of female screw rods to support a circuit board or any of a variety of electronic devices above the motherboard. After insertion of female screw rods into the respective mounting holes, screws are respectively mounted in the female screw rods to fixedly secure the circuit board or electronic device in place. After installation of related parts in the motherboard, the motherboard is delivered to a tin soldering stove to receive a soldering process. According to current motherboard fabrication methods, electronic components are automatically installed in the motherboard by SMT (surface mounting technique). However, because female screw rods have a screw hole extended through the top and bottom sides thereof, they cannot be automatically sucked by the vacuum suction unit of a SMT automatic machine for quick installation in the motherboard. Therefore, workers achieve the installation of female screw rods manually. This manual installation procedure takes much time and labor and, cannot eliminate human errors. In order to eliminate this problem, some manufacturers plug a plastic plug into the screw hole of each female screw rod before its installation so that a SMT automatic machine can suck in the female screw rod for quick installation in a motherboard. However, it is not easy to remove the plastic plug from each female screw rod after mounting in the motherboard. During SMT tin soldering process of the motherboard, the plastic plug may be melted and bonded to the periphery of the screw hole. In this case, it takes much time and labor to clean the screw hole.

In prior art, discloses a female screw device applicable for quick installation in a computer motherboard by a SMT automatic machine. This design of female screw device comprises a female screw rod adapted for mounting in a mounting hole of a motherboard to support an object above the motherboard, and a quick-release cap adapted for fastening to the female screw rod to close the screw hole for enabling the female screw rod to be installed in a mounting hole of a motherboard by a SMT automatic machine. The quick-release cap comprises a cap body and a plurality of springy clamping arms adapted for fastening to the female screw rod to secure the cap body to the female screw rod to block up the screw hole. This design is still not satisfactory in function. Because the springy clamping arms are extended from the periphery of the cap body and adapted for clamping on the periphery of the female screw rod, they may interfere with the installation of other electronic parts in the motherboard.

SUMMARY OF THE INVENTION

The present invention has been accomplished under the circumstances in view. It is the main object of the present invention to provide a female screw device, which is practical for installation in a motherboard by a SMT (surface mounting technique) automatic machine without interfering with the installation of other electronic parts in the motherboard. To achieve this and other objects of the present invention, the female screw device comprises a female screw rod adapted for mounting in a mounting hole of a motherboard to support an object above the motherboard, and a quick-release cap adapted for fastening to the female screw rod to close the screw hole for enabling the female screw rod to be installed in a mounting hole of a motherboard by a SMT automatic machine. The quick-release cap comprises a cap body, and a plurality of springy retaining arms downwardly extended from the cap body and adapted for fastening to the screw hole of the female screw rod to secure the cap body to the female screw rod to block up the screw hole.

DETAILED DESCRIPTION OF THE PREFERRED EMBODIMENT

Figure 1:
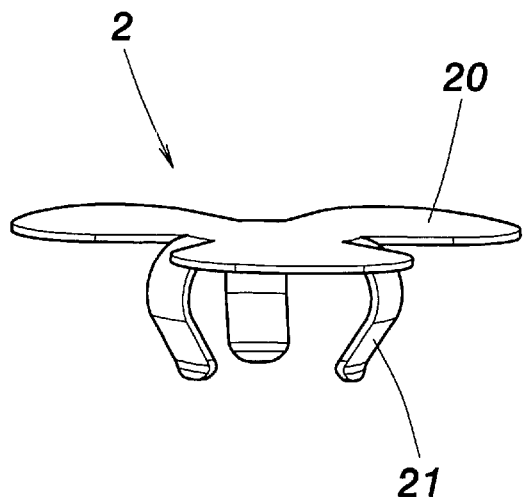
FIG. 1 is a perspective view of a quick-release cap for a female screw device according to the present invention.
Figure 2:
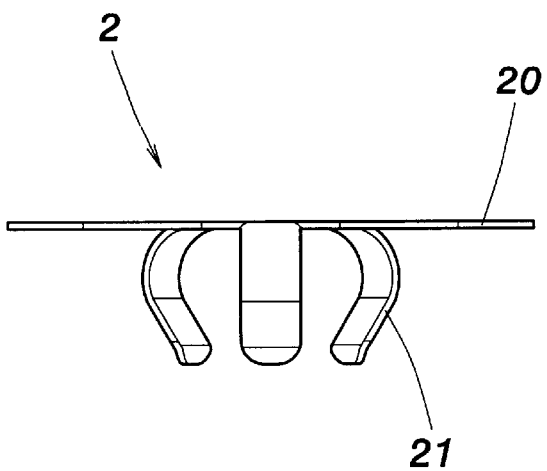
FIG. 2 is a plain view of the quick-release cap according to the present invention.
Figure 3:
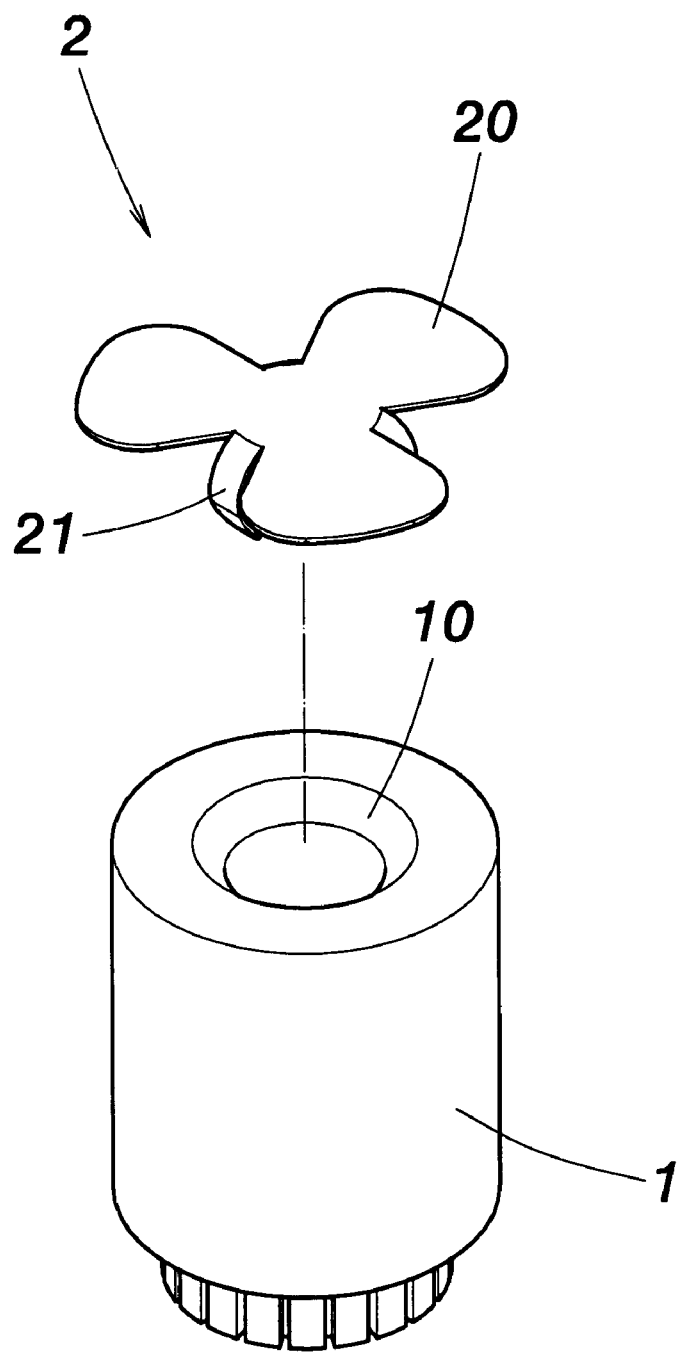
FIG. 3 is an exploded view of the female screw device according to the present invention.
Figure 4:
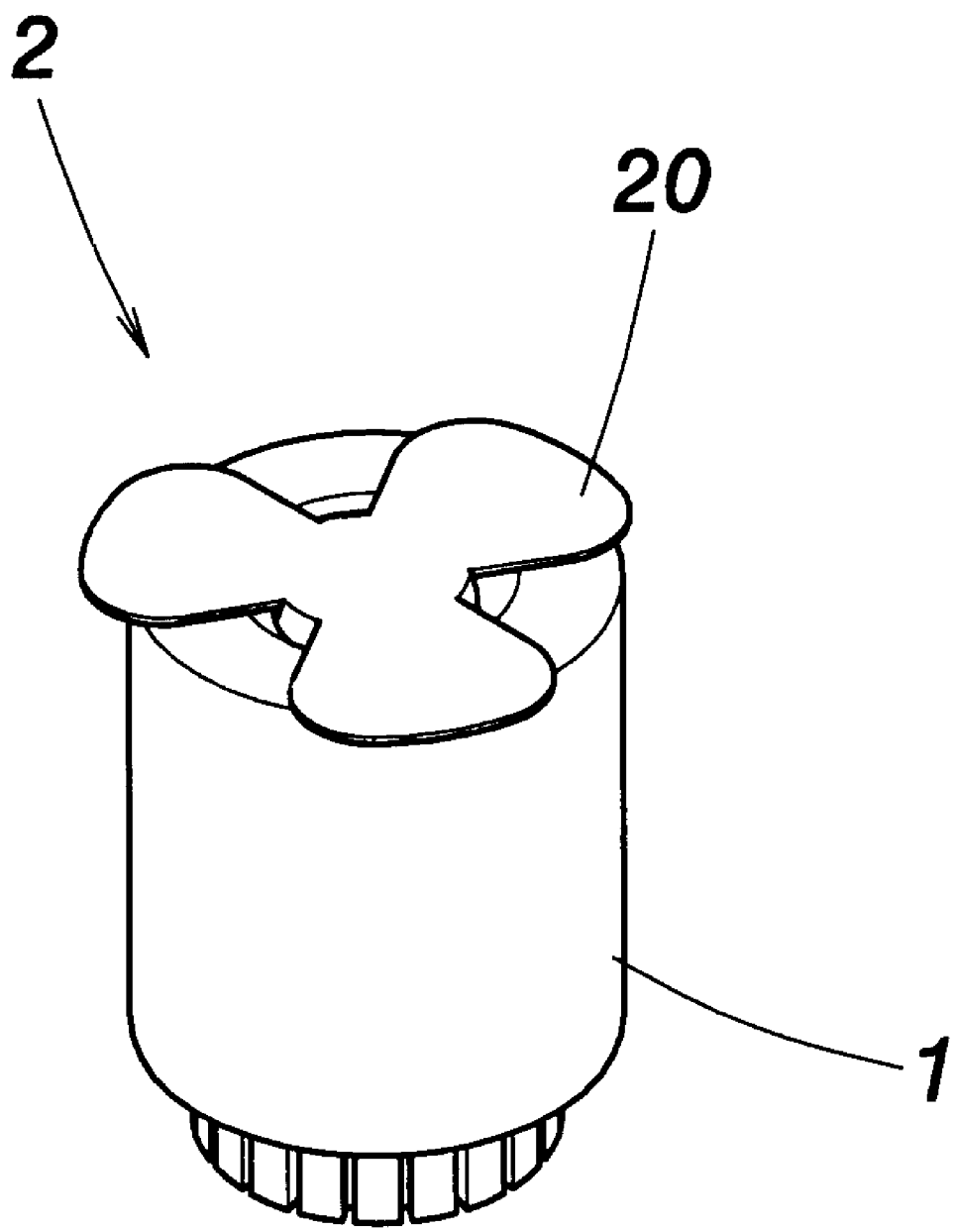
FIG. 4 is an elevational assembly view of the female screw device according to the present invention.
Figure 5:
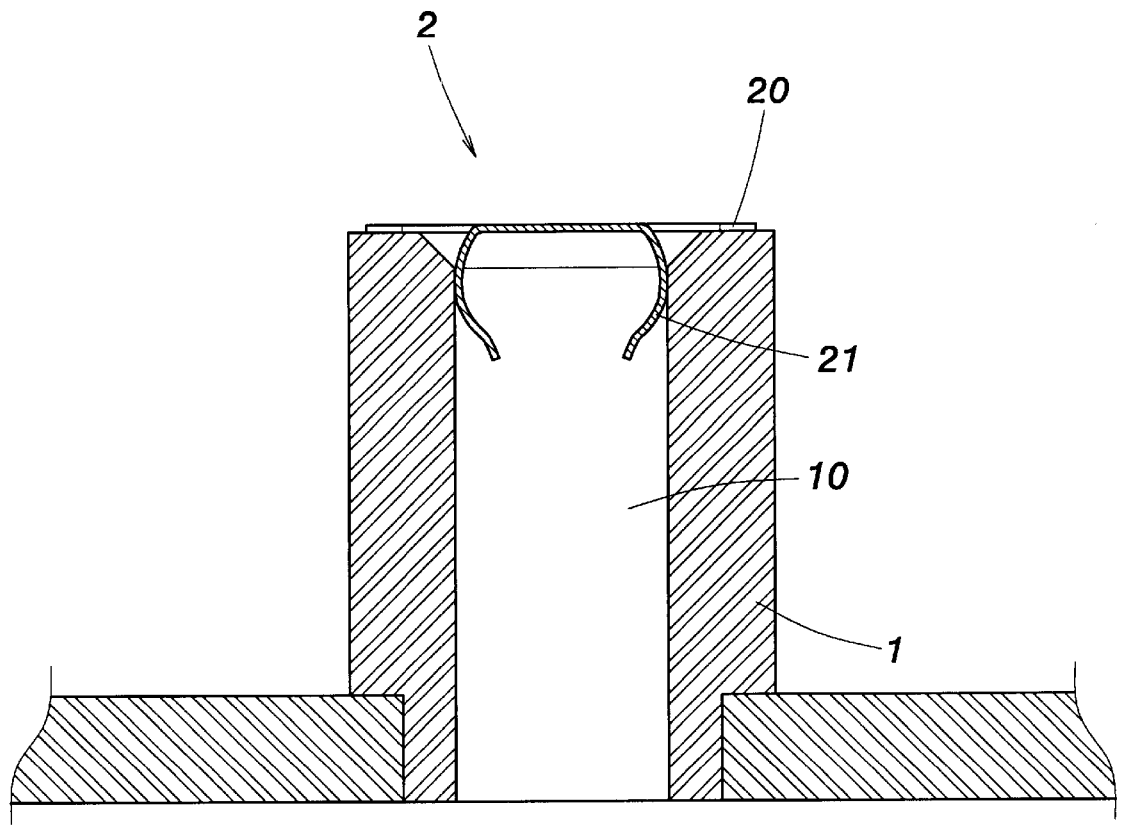
FIG. 5 is a sectional view of the present invention showing the female screw device mounted in a motherboard.

Referring to FIGS. from 1 through 5, a female screw device in accordance with the present invention is shown comprised of a female screw rod 1, and a quick-release cap 2.

The female screw rod 1 is adapted for fastening to one mounting hole in a motherboard, having a screw hole 10 extended through the top and bottom sides. The female screw rod 1 can be made having a cylindrical shape or the shape of any of a variety of prisms.

The quick-release cap 2 is made of a resilient metal plate, comprising a cap body 20 adapted for temporarily blocking up the screw hole 10 of the female screw rod 1, and at least two, for example, three springy retaining arms 21 downwardly extended from the bottom sidewall of the cap body 20 and equiangularly spaced from one another and adapted for fastening to the screw hole 10 of the female screw rod 1 to secure the quick-release cap 2 to the female screw rod 1 in position. According to this embodiment, the springy retaining arms 21 are smoothly arched.

Before installation of the female screw rod 1 in the motherboard, the springy retaining arms 21 of the quick-release cap 2 are fastened to the screw holes 10 of the female screw rod 1, keeping the cap body 20 closely attached to the top side of the female screw rod 1 to block up the screw hole 10. Thus, the female screw device can be sucked by the vacuum suction unit of the SMT automatic machine and then automatically installed in the motherboard. During installation of the female screw device, the quick-release cap 2 does not interfere with other electronic components of the motherboard. Further, the motherboard receiving a tin soldering process in a SMT soldering stove, the soldering process does not affect the physical properties of the quick-release cap 2 and its positioning in the female screw rod 1. After SMT, use a pry or the like to remove the quick-release cap 2 from the female screw rod 1 for enabling a screw to be mounted in the screw hole 10 of the female screw rod 1 to secure the desired object to the motherboard and to keep the object spaced from the motherboard at a distance.

Figure 6:
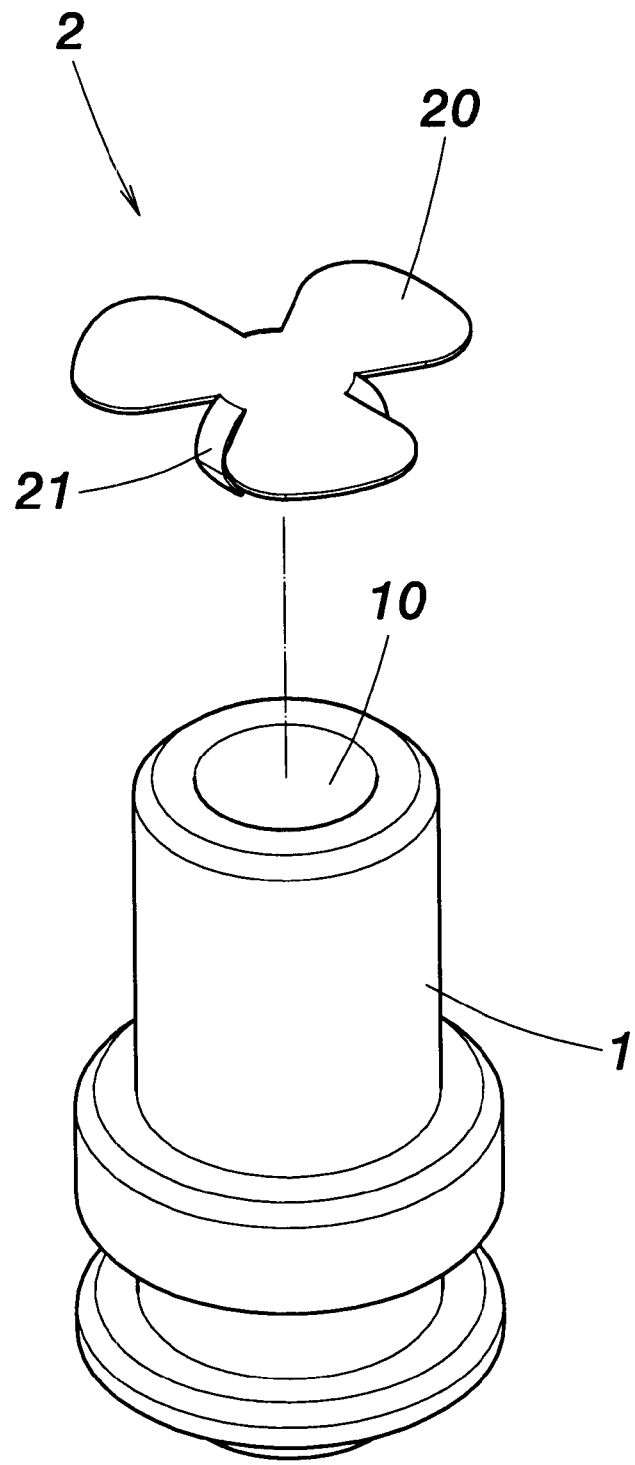
FIG. 6 is an exploded view of an alternate form of the female screw device according to the present invention.
Figure 7:
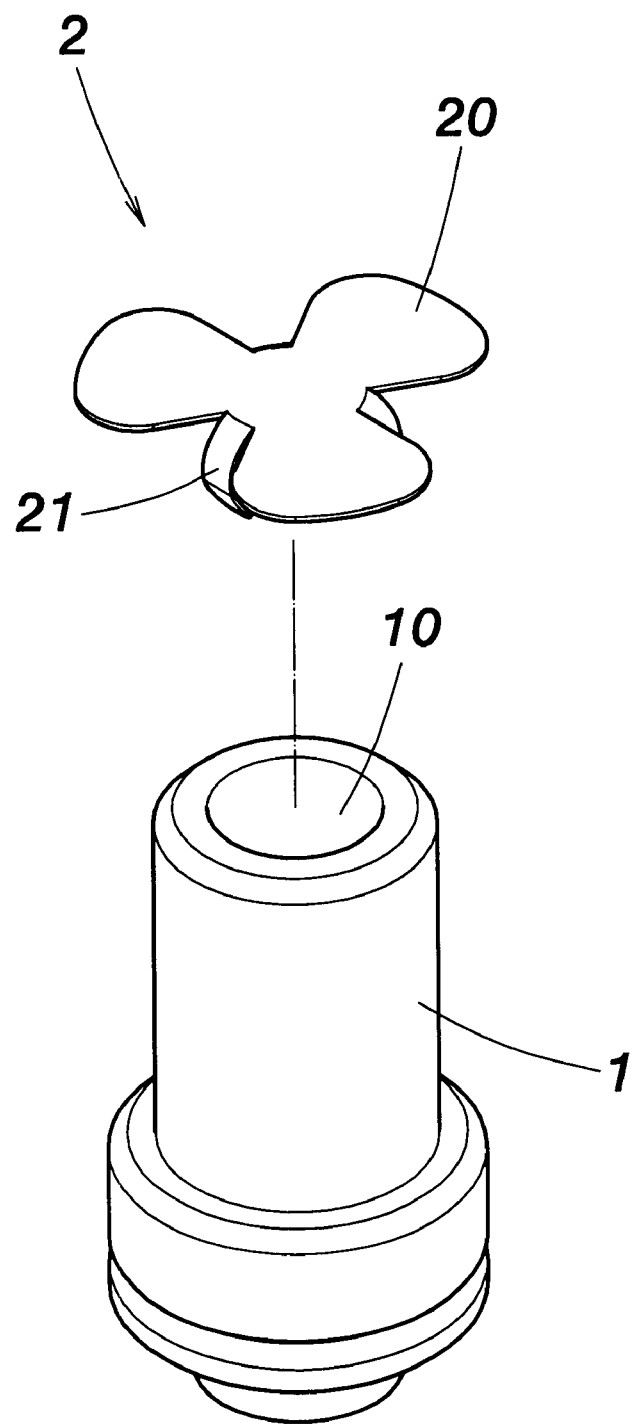
FIG. 7 is an exploded view of another alternate form of the female screw device according to the present invention.

FIGS. 6 and 7 show two different alternate forms of the female screw rod 1 according to the present invention for fastening different objects to a motherboard. Any change in shape, the female screw rod 1 achieves the aforesaid advantages for SMT automatic installation.

A prototype of female screw device has been constructed with the features of the annexed drawings of FIGS. 1~7. The female screw device functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A female screw device comprising:

A female screw rod adapted for mounting in a mounting hole of a motherboard, said female screw rod having a screw hole; and a quick-release cap having a cap body for blocking up the screw hole of the female screw rod, and a plurality of springy retaining arms extending toward the screw hole and adapted for fastening thereby for the quick-release cap temporarily fastening to the female screw rod.

2. The female screw device as claimed in claim 1, wherein said springy retaining arms have a smoothly arched shape.

* * * * *